(12) United States Patent
Cao et al.

(10) Patent No.: US 11,705,032 B2
(45) Date of Patent: Jul. 18, 2023

(54) DRIVING CIRCUIT AND DISPLAY PANEL

(71) Applicant: Wuhan China Star Optoelectronics Technology Co., Ltd., Hubei (CN)

(72) Inventors: Haiming Cao, Hubei (CN); Yanqing Guan, Hubei (CN)

(73) Assignee: Wuhan China Star Optoelectronics Technology Co., Ltd., Hubei (CN)

( * ) Notice: Subject to any disclaimer, the term of this patent is extended or adjusted under 35 U.S.C. 154(b) by 551 days.

(21) Appl. No.: 16/961,956

(22) PCT Filed: Jun. 12, 2020

(86) PCT No.: PCT/CN2020/095851
§ 371 (c)(1),
(2) Date: Jul. 14, 2020

(87) PCT Pub. No.: WO2021/227175
PCT Pub. Date: Nov. 18, 2021

(65) Prior Publication Data
US 2023/0102348 A1    Mar. 30, 2023

(30) Foreign Application Priority Data
May 13, 2020 (CN) .......................... 202010400404.5

(51) Int. Cl.
*G09G 3/20*    (2006.01)
(52) U.S. Cl.
CPC ....... *G09G 3/20* (2013.01); *G09G 2300/0426* (2013.01); *G09G 2310/0283* (2013.01); *G09G 2310/08* (2013.01); *G09G 2330/021* (2013.01)

(58) Field of Classification Search
CPC ............. G09G 3/20; G09G 2300/0426; G09G 2310/0283; G09G 2310/08; G09G 2330/021
See application file for complete search history.

(56) References Cited

U.S. PATENT DOCUMENTS

| 2017/0084239 | A1 | 3/2017 | Lee et al. |
| 2017/0169778 | A1 | 6/2017 | Mei |
| 2017/0301302 | A1 | 10/2017 | Zhao |
| 2020/0058243 | A1* | 2/2020 | Seong ....................... G09G 3/20 |
| 2020/0058249 | A1* | 2/2020 | Ok ......................... G09G 3/3208 |
| 2020/0058269 | A1* | 2/2020 | Zhao ........................ G09G 3/20 |

(Continued)

FOREIGN PATENT DOCUMENTS

| CN | 102097074 | 6/2011 |
| CN | 104795034 | 7/2015 |
| CN | 104966500 | 10/2015 |

(Continued)

*Primary Examiner* — Sejoon Ahn
(74) *Attorney, Agent, or Firm* — PV IP PC; Wei Te Chung; Zhigang Ma

(57) ABSTRACT

A driving circuit and a display panel are disclosed. The driving circuit includes a plurality of cascaded driving units. The driving unit includes a forward/backward scan control module, a first control node controlling module, a second control node controlling module, a global control module, a regulating module, a first output module configured to output a stage signal, and a second output module configured to output a gate driving signal. A voltage level of the gate driving signal is higher than a voltage level of the stage signal.

20 Claims, 2 Drawing Sheets

(56) References Cited

U.S. PATENT DOCUMENTS

2020/0226993 A1    7/2020  Zhang et al.

FOREIGN PATENT DOCUMENTS

| CN | 105575349 | 5/2016 |
| CN | 108321159 | 7/2018 |
| CN | 108376533 | 8/2018 |
| CN | 108630167 | 10/2018 |
| CN | 109036303 | 12/2018 |
| CN | 109036304 | 12/2018 |
| CN | 109961737 | 7/2019 |
| CN | 110782855 | 2/2020 |

* cited by examiner

DRIVING CIRCUIT AND DISPLAY PANEL

RELATED APPLICATIONS

This application is a National Phase of PCT Patent Application No. PCT/CN2020/095851 having International filing date of Jun. 12, 2020, which claims the benefit of priority of Chinese Patent Application No. 202010400404.5 filed on May 13, 2020. The contents of the above applications are all incorporated by reference as if fully set forth herein in their entirety.

FIELD AND BACKGROUND OF THE INVENTION

The present invention relates to a display technique, and more particularly, to a driving circuit and a display panel.

Low temperature polycrystalline oxide (LTPO) technique is widely used in display panels because it has the advantages of both low temperature poly-silicon (LTPS) technique and the indium gallium zinc oxide (IGZO) technique and thus the display panels could have high driving capability and low power consumption.

The LTPO technique could expand the application of the equipment to super low frequency and high frequency display and improve the power consumption and visual experience. Because the migration of the IGZO is comparatively low, in the high frequency application, the display area may not be charged enough to have enough voltage level because the charging time is comparatively short.

Therefore, the conventional LTPO technique has the above issue, which makes IGZO not have enough charged voltage level and needs to be improved.

SUMMARY OF THE INVENTION

One objective of an embodiment of the present invention is to provide a display panel and a driving circuit, to solve the above-mentioned issue of the insufficient charged voltage level of the IGZO.

According to an embodiment of the present invention, a driving circuit is disclosed. The driving circuit comprises a plurality of cascaded driving units. The driving unit comprises: a forward/backward scan control module, configured to control the driving circuit to perform a forward scan according to a forward scan control signal or control the driving circuit to perform a backward scan according to a backward scan control signal; a first control node controlling module, electrically connected to the forward/backward scan control module, wherein an output end of the first control node controlling module is electrically connected to a first control node to control a voltage level of the first control node; a second control node controlling module, electrically connected to the forward/backward scan control module and the first control node controlling module, wherein an output end of the second control node controlling module is electrically connected to a second control node to control a voltage level of the second control node; a global control module, configured to control the driving unit to output a global control signal; a regulating module, configured to maintain the voltage level of the second control node; a first output module, electrically connected to the first control node and the second control node, configured to output a stage signal; and a second output module, electrically connected to the first control node and the second control node, configured to output a gate driving signal; wherein a voltage level of the gate driving signal is higher than a voltage level of the stage signal.

In some embodiments, the forward/backward scan control module comprises: a first thin film transistor (TFT), having a gate electrically connected to a first stage signal, a first electrode electrically connected to the forward scan control signal, and a second electrode, electrically connected to the second control node; and a second TFT, having a gate receiving a second stage signal, a first electrode electrically connected to the backward scan control signal, and a second electrode electrically connected to the second electrode of the first TFT.

In some embodiments, the first control node controlling module comprises: a third TFT, having a gate electrically connected to the forward scan control signal, a first electrode electrically connected to a first clock signal, and a second electrode; a fourth TFT, having a gate electrically connected to the backward scan control signal, a first electrode electrically connected to a second clock signal, and a second electrode; a fifth TFT, having a gate electrically connected to the second electrode of the third TFT and the second electrode of the fourth TFT, a first electrode electrically connected to a high voltage signal, and a second electrode electrically connected to the first control node; a sixth TFT, having a gate electrically connected to the second electrode of the second TFT, a first electrode electrically connected to a low voltage signal, and a second electrode electrically connected to the first control node; and a seventh TFT, having a gate electrically connected to a first global control signal, a first electrode electrically connected to the low voltage signal, and a second electrode electrically connected to the first control node.

In some embodiments, the second control node controlling module comprises: an eighth TFT, having a gate electrically connected to the first control node, a first electrode electrically connected to the low voltage signal, and a second electrode electrically connected to the second control node.

In some embodiments, the global control module comprises: a ninth TFT, having a gate electrically connected to the first global control signal, a first electrode, electrically connected to the first global control signal, and a second electrode electrically connected to an output end of the second output module; and a tenth TFT, having a gate electrically connected to a second global control signal, a first electrode electrically connected to the low voltage signal, and a second electrode electrically connected to the output end of the second output module.

In some embodiments, the regulating module comprises: an eleventh TFT, having a gate electrically connected to the high voltage signal, a first electrode electrically connected to the second control node, and a second electrode.

In some embodiments, the first output module comprises: a twelfth TFT, having a gate electrically connected to the second electrode of the eleventh TFT, a first electrode electrically connected to a third clock signal, a second electrode electrically connected to an output end of the first output module; and a thirteenth TFT, having a gate electrically connected to the first control node, a first electrode electrically connected to the low voltage signal, and a second electrode electrically connected to the output end of the first output module.

In some embodiments, the second output module comprises: a fourteenth TFT, having a gate electrically connected to the second electrode of the eleventh TFT, a first electrode electrically connected to a fourth clock signal, and a second electrode electrically connected to the output end of the second output module; and a fifteenth TFT, having a gate electrically connected to the first control node, a first electrode electrically connected to the low voltage signal, and a second electrode electrically connected to the output end of the second output module.

In some embodiments, a timing of the fourth clock signal is identical to a timing of the third clock signal, a voltage level of the fourth clock signal is higher than a voltage level of the third clock signal; the timing of the third clock signal and a timing of the second clock signal are staggered; the timing of the second clock signal and a timing of the first clock signal are staggered; the timing of the third clock signal and the timing of the first clock signal are staggered; and the voltage level of the third clock signal is identical to a voltage level of the second clock signal and a voltage level of the first clock signal.

In some embodiments, the stage signal is a driving signal transferred to low temperature poly-silicon (LTPS) TFTs in a non-display area of a display panel, the gate driving signal is a driving signal transferred to oxide TFTs in a display area of the display panel.

According to an embodiment of the present invention, a display panel is disclosed. The display panel comprises a driving circuit comprising a plurality of cascaded driving units. The driving unit includes a forward/backward scan control module, a first control node controlling module, a second control node controlling module, a global control module, a regulating module, a first output module, and a second output module. The forward/backward scan control module is configured to control the driving circuit to perform a forward scan according to a forward scan control signal or control the driving circuit to perform a backward scan according to a backward scan control signal. The first control node controlling module is electrically connected to the forward/backward scan control module. An output end of the first control node controlling module is electrically connected to a first control node to control a voltage level of the first control node. The second control node controlling module is electrically connected to the forward/backward scan control module and the first control node controlling module. An output end of the second control node controlling module is electrically connected to a second control node to control a voltage level of the second control node. The global control module is configured to control the driving unit to output a global control signal. The regulating module is configured to maintain the voltage level of the second control node. The first output module, electrically connected to the first control node and the second control node, is configured to output a stage signal. The second output module, electrically connected to the first control node and the second control node, is configured to output a gate driving signal. A voltage level of the gate driving signal is higher than a voltage level of the stage signal.

In some embodiments, the forward/backward scan control module comprises: a first thin film transistor (TFT), having a gate electrically connected to a first stage signal, a first electrode electrically connected to the forward scan control signal, and a second electrode, electrically connected to the second control node; and a second TFT, having a gate receiving a second stage signal, a first electrode electrically connected to the backward scan control signal, and a second electrode electrically connected to the second electrode of the first TFT.

In some embodiments, the first control node controlling module comprises: a third TFT, having a gate electrically connected to the forward scan control signal, a first electrode electrically connected to a first clock signal, and a second electrode; a fourth TFT, having a gate electrically connected to the backward scan control signal, a first electrode electrically connected to a second clock signal, and a second electrode; a fifth TFT, having a gate electrically connected to the second electrode of the third TFT and the second electrode of the fourth TFT, a first electrode electrically connected to a high voltage signal, and a second electrode electrically connected to the first control node; a sixth TFT, having a gate electrically connected to the second electrode of the second TFT, a first electrode electrically connected to a low voltage signal, and a second electrode electrically connected to the first control node; and a seventh TFT, having a gate electrically connected to a first global control signal, a first electrode electrically connected to the low voltage signal, and a second electrode electrically connected to the first control node.

In some embodiments, the second control node controlling module comprises: an eighth TFT, having a gate electrically connected to the first control node, a first electrode electrically connected to the low voltage signal, and a second electrode electrically connected to the second control node.

In some embodiments, the global control module comprises: a ninth TFT, having a gate electrically connected to the first global control signal, a first electrode, electrically connected to the first global control signal, and a second electrode electrically connected to an output end of the second output module; and a tenth TFT, having a gate electrically connected to a second global control signal, a first electrode electrically connected to the low voltage signal, and a second electrode electrically connected to the output end of the second output module.

In some embodiments, the regulating module comprises: an eleventh TFT, having a gate electrically connected to the high voltage signal, a first electrode electrically connected to the second control node, and a second electrode.

In some embodiments, the first output module comprises: a twelfth TFT, having a gate electrically connected to the second electrode of the eleventh TFT, a first electrode electrically connected to a third clock signal, a second electrode electrically connected to an output end of the first output module; and a thirteenth TFT, having a gate electrically connected to the first control node, a first electrode electrically connected to the low voltage signal, and a second electrode electrically connected to the output end of the first output module.

In some embodiments, the second output module comprises: a fourteenth TFT, having a gate electrically connected to the second electrode of the eleventh TFT, a first electrode electrically connected to a fourth clock signal, and a second electrode electrically connected to the output end of the second output module; and a fifteenth TFT, having a gate electrically connected to the first control node, a first electrode electrically connected to the low voltage signal, and a second electrode electrically connected to the output end of the second output module.

In some embodiments, a timing of the fourth clock signal is identical to a timing of the third clock signal, a voltage level of the fourth clock signal is higher than a voltage level of the third clock signal; the timing of the third clock signal and a timing of the second clock signal are staggered; the timing of the second clock signal and a timing of the first clock signal are staggered; the timing of the third clock signal and the timing of the first clock signal are staggered; and the voltage level of the third clock signal is identical to a voltage level of the second clock signal and a voltage level of the first clock signal.

In some embodiments, the stage signal is a driving signal transferred to low temperature poly-silicon (LTPS) TFTs in a non-display area of a display panel, the gate driving signal is a driving signal transferred to oxide TFTs in a display area of the display panel.

According to an embodiment of the present invention, a driving circuit and a display panel are provided. The display panel comprises a driving circuit comprising a plurality of cascaded driving units. The driving unit includes a forward/backward scan control module, a first control node controlling module, a second control node controlling module, a global control module, a regulating module, a first output module, and a second output module. The forward/backward scan control module is configured to control the driving circuit to perform a forward scan according to a forward scan control signal or control the driving circuit to perform a backward scan according to a backward scan control signal. The first control node controlling module is electrically connected to the forward/backward scan control module. An output end of the first control node controlling module is electrically connected to a first control node to control a voltage level of the first control node. The second control node controlling module is electrically connected to the forward/backward scan control module and the first control node controlling module. An output end of the second control node controlling module is electrically connected to a second control node to control a voltage level of the second control node. The global control module is configured to control the driving unit to output a global control signal. The regulating module is configured to maintain the voltage level of the second control node. The first output module, electrically connected to the first control node and the second control node, is configured to output a stage signal. The second output module, electrically connected to the first control node and the second control node, is configured to output a gate driving signal. A voltage level of the gate driving signal is higher than a voltage level of the stage signal. The driving circuit has a first output module for outputting a stage signal having a high voltage level to the LTPS TFTs in the non-display area and has a second output module for outputting a gate driving signal having a voltage level higher than the stage signal, to the IGZO TFTs. This mechanism increases the current to meet the charging demand of the IGZO technique so that the charged voltage level of the IGZO technique is enough. Furthermore, this mechanism also ensures the stability of the entire driving circuit. This technique has two output voltages for driving the display panel, which makes the display panel have a better stability, a lower power consumption, and a better visual effect.

BRIEF DESCRIPTION OF THE SEVERAL VIEWS OF THE DRAWINGS

To describe the technical solutions in the embodiments of this application more clearly, the following briefly introduces the accompanying drawings required for describing the embodiments. Apparently, the accompanying drawings in the following description show merely some embodiments of this application, and a person of ordinary skill in the art may still derive other drawings from these accompanying drawings without creative efforts.

DESCRIPTION OF SPECIFIC EMBODIMENTS OF THE INVENTION

Specifically, the terminologies in the embodiments of the present invention are merely for describing the purpose of the certain embodiment, but not to limit the invention. Examples and the appended claims be implemented in the present invention requires the use of the singular form of the book "an", "the" and "the" are intended to include most forms unless the context clearly dictates otherwise. It should also be understood that the terminology used herein that "and/or" means and includes any or all possible combinations of one or more of the associated listed items.

Figure 1:
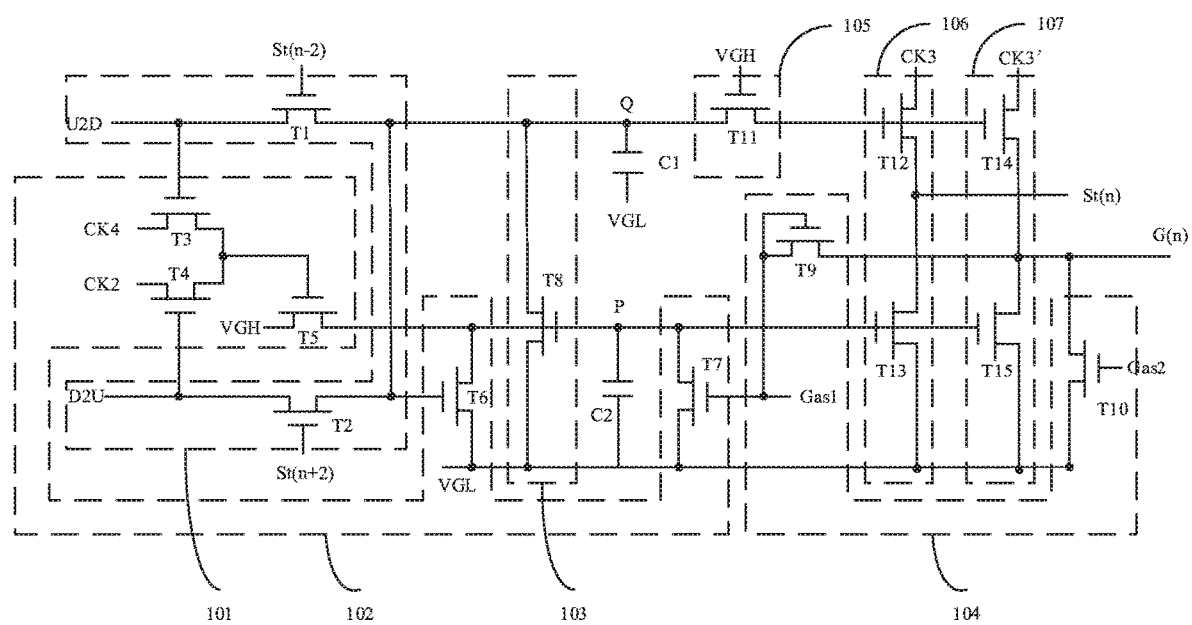
FIG. 1 is a diagram of a driving circuit according to an embodiment of the present invention.

As previously mentioned, the LTO technique may have IGZO's issue of an insufficient charged voltage level. Therefore, a driving circuit is provided to solve the above-mentioned issue. Please refer to FIG. 1. FIG. 1 is a diagram of a driving circuit according to an embodiment of the present invention. The driving circuit comprises a plurality of cascaded driving units. The driving unit comprises: a forward/backward scan control module 101, a first control node controlling module 102, a second control node controlling module 103, a global control module 104, a regulating module 105, a first output module 106, and a second output module 107.

The forward/backward scan control module 101 is configured to control the driving circuit to perform a forward scan according to a forward scan control signal or control the driving circuit to perform a backward scan according to a backward scan control signal.

The first control node controlling module 102 is electrically connected to the forward/backward scan control module 101. The output end of the first control node controlling module 102 is electrically connected to a first control node P to control a voltage level of the first control node P.

The second control node controlling module 103 is electrically connected to the forward/backward scan control module 101 and the first control node controlling module 102. The output end of the second control node controlling module 103 is electrically connected to the second control node Q to control a voltage level of the second control node Q.

The global control module 104 is configured to control the driving unit to output a global control signal.

The regulating module 105 is configured to maintain the voltage level of the second control node Q.

The first output module 106 is electrically connected to the first control node P and the second control node Q and is configured to output a stage signal.

The second output module 107 is electrically connected to the first control node P and the second control node Q and is configured to output a gate driving signal. Here, the voltage level of the gate driving signal is higher than the voltage level of the stage signal.

According to an embodiment of the present invention, a driving circuit is provided. The driving circuit has a first output module for outputting a stage signal having a high voltage level to the LTPS TFTs in the non-display area and has a second output module for outputting a gate driving signal having a voltage level higher than the stage signal, to the IGZO TFTs in the display area. This mechanism increases the current to meet the charging demand of the IGZO technique so that the charged voltage level of the IGZO technique is enough. Furthermore, this mechanism also ensures the stability of the entire driving circuit. This technique has two output voltages for driving the display panel, which makes the display panel have a better stability, a lower power consumption, and a better visual effect.

As shown in FIG. 1, an $n^{th}$-stage driving unit in a 8CK circuit structure is used as an example to illustrate the driving circuit of the present invention. Please note, the driving circuit of the present invention could be used in 12CK and 16CK circuit structures. In the following embodiments, the TFT could be an N-type TFT or a T-type TFT. The first electrode of the TFT is an electrode of a signal input end and the second electrode of the TFT is an electrode of a signal output end.

The forward/backward scan control module 101 comprises a first TFT T1 and a second TFT T2. The gate of the first TFT T1 is electrically connected to a first stage signal St(n−2). The first stage signal St(n−2) is the stage signal outputted by the $(n-2)^{th}$-stage driving unit. The first electrode of the first TFT T1 is electrically connected to the forward scan control signal U2D. The second electrode of the first TFT T1 is electrically connected to the second control node Q. The gate of the second TFT T2 receives a second stage signal St(n+2). The second stage signal St(n+2) is the stage signal outputted by the $(n+2)^{th}$-stage driving unit. The first electrode of the second TFT T2 is electrically connected to the backward scan control signal D2U. The second electrode of the second TFT T2 is electrically connected to the second electrode of the first TFT T1.

When the display panel is in the forward scan stage, the forward scan control signal U2D corresponds to a high voltage level and the backward scan control signal D2U corresponds to a low voltage level. At this time, the driving circuit scans the display panel line by line from its top to its bottom. In contrast, when the display panel is in the backward scan stage, the forward scan control signal U2D corresponds to a low voltage level and the backward scan control signal D2U corresponds to a high voltage level. At this time, the driving circuit scans the display panel line by line from its bottom to its top.

The first control node controlling module 102 comprises a third TFT T3, a fourth TFT T4, a fifth TFT T5, a sixth TFT T6, and a seventh TFT T7. The gate of the third TFT T3 is electrically connected to the forward scan control signal U2D. The first electrode of the third TFT T3 is electrically connected to a first clock signal CK2. The gate of the fourth TFT T4 is electrically connected to the backward scan control signal D2U. The first electrode of the fourth TFT T4 is electrically connected to a second clock signal CK4. The gate of the fifth TFT T5 is electrically connected to the second electrode of the third TFT T3 and the second electrode of the fourth TFT T4. The first electrode of the fifth TFT T5 is electrically connected to a high voltage signal VGH. The second electrode of the fifth TFT T5 is electrically connected to the first control node P. The gate of the sixth TFT T6 is electrically connected to the second electrode of the second TFT T2. The first electrode of the sixth TFT T6 is electrically connected to a low voltage signal VGL. The second electrode of the sixth TFT T6 is electrically connected to the first control node P. The gate of the seventh TFT T7 is electrically connected to the first global control signal Gas1. The first electrode of the seventh TFT T7 is electrically connected to the low voltage signal VGL. The second electrode of the seventh TFT T7 is electrically connected to the first control node P.

The second control node controlling module 103 comprises an eighth TFT T8. The eighth TFT T8 has a gate electrically connected to the first control node P, a first electrode electrically connected to the low voltage signal VGL, and a second electrode electrically connected to the second control node Q.

The global control module 104 comprises a ninth TFT T9 and a tenth TFT T10. The gate and the first electrode of the ninth TFT T9 are electrically connected to the first global control signal Gas1. The second electrode of the ninth TFT T9 is electrically connected to an output end of the second output module 107. The gate of the tenth TFT T10 is electrically connected to a second global control signal Gas2. The first electrode of the tenth TFT T10 is electrically connected to the low voltage signal VGL. The second electrode of the tenth TFT T10 is electrically connected to the output end of the second output module 107.

When the entire display panel is being scanned, the first global control signal Gas1 usually corresponds to a high voltage level, and the forward scan control signal U2D, the backward scan signal D2U, the second global control signal Gas2 and the clock signal all correspond to a low voltage level. The ninth TFT T9 is turned on. The first control node P and the second control node Q both correspond to a low voltage level. The tenth TFT T10, the twelfth TFT T12, the thirteenth TFT T13, the fourteenth TFT T14, the fifteenth TFT T15 are all turned off. The driving circuit outputs the first global control signal Gas1 to the display panel such that the display panel performs all-gate-on operation. That is, all the gate driving signals in the GOA circuit are set as a working voltage level such that the entire display panel is scanned.

When the scan operation to any portion of the entire display panel needs to be ceased, the second global control signal Gas2 corresponds to a high voltage level. The first global control signal Gas1, the forward scan control signal U2D, the backward scan control signal D2U, and the clock signal all correspond to a low voltage level. The tenth TFT T10 is turned on. The first control node P and the second control node Q both correspond to a low voltage level. The ninth TFT T9, the twelfth TFT T12, the thirteenth TFT T13, the fourteenth TFT T14, the fifteenth TFT T15 are all turned off. The driving circuit outputs a low voltage signal VGL to the display panel such that the display panel performs all-gate-off operation. That is, all the gate driving signals in the GOA circuit are set as a non-working voltage level such that any scan operation on the entire display panel is ceased.

When the display panel is in the normal mode to display an image, the first global control signal Gas1 and the second global signal Gas2 both correspond to a low voltage level. The ninth TFT T9 and the tenth TFT T10 are turned off.

The regulating module 105 comprises an eleventh TFT T11, having a gate electrically connected to the high voltage signal VGH, a first electrode electrically connected to the second control node Q. The eleventh TFT T11 is always turned on to maintain the voltage level of the second control node Q.

The first output module 106 comprises the twelfth TFT T12 and the thirteenth TFT T13. The gate of the twelfth TFT T12 is electrically connected to the second electrode of the eleventh TFT T11. The first electrode of the twelfth TFT T12 is electrically connected to a third clock signal CK3. The second electrode the twelfth TFT T12 is electrically connected to an output end of the first output module 106. The gate of the thirteenth TFT T13 is electrically connected to the first control node P. The first electrode of the thirteenth TFT T13 is electrically connected to the low voltage signal VGL. The second electrode of the thirteenth TFT T13 is electrically connected to the output end of the first output module 106.

The second output module 107 comprises the fourteenth TFT T14 and the fifteenth TFT T15. The gate of the fourteenth TFT T14 is electrically connected to the second electrode of the eleventh TFT T11. The first electrode of the fourteenth TFT T14 is electrically connected to a fourth clock signal CK3'. The second electrode of the fourteenth TFT T14 is electrically connected to the output end of the second output module 107. The gate of the fifteenth TFT T15 is electrically connected to the first control node P. The first electrode of the fifteenth TFT T15 electrically connected to the low voltage signal VGL. The second electrode of the fifteenth TFT T15 is electrically connected to the output end of the second output module 107.

Figure 2:
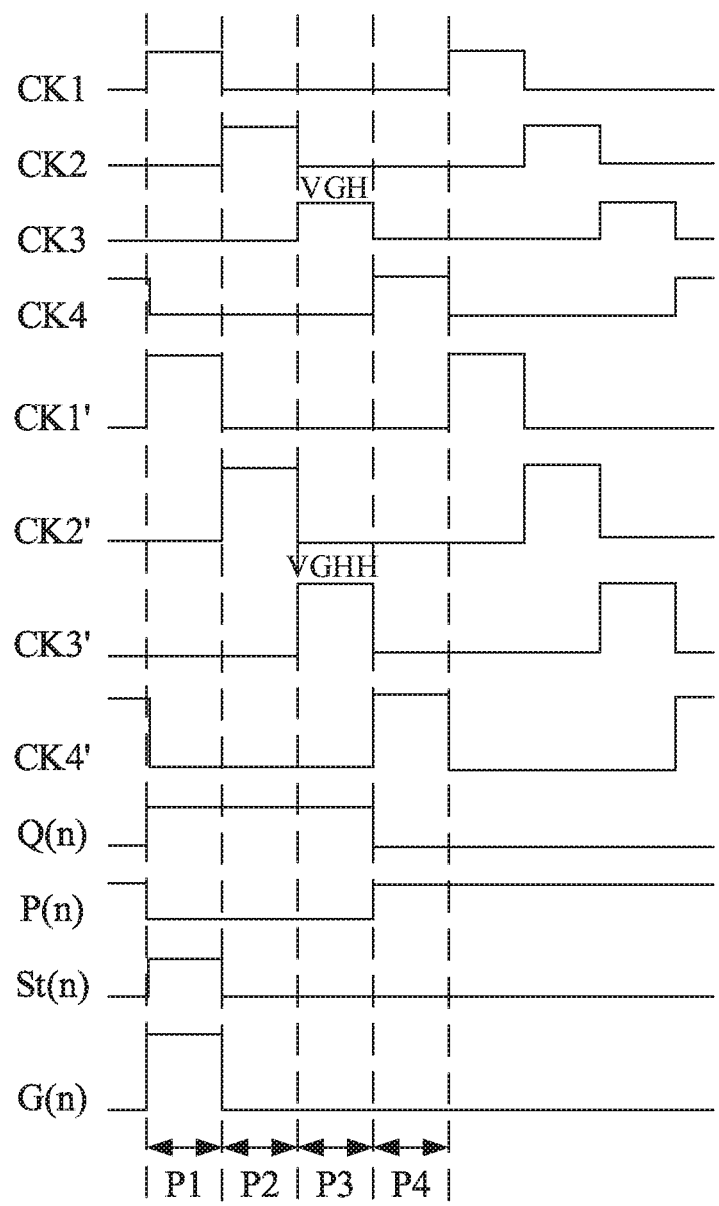
FIG. 2 is a timing diagram of a driving circuit according to an embodiment of the present invention.

Please refer to FIG. 2. FIG. 2 is a timing diagram of a driving circuit according to an embodiment of the present invention. An 8CK circuit structure is shown in FIG. 2 as an example. The first clock signal CK2, the second clock signal CK4, the third clock signal CK3, and the fifth clock signal CK1 have the same period and voltage level. The timings of the first clock signal CK2, the second clock signal CK4, the third clock signal CK3 and the fifth clock CK1 are staggered. That is, when the impulse signal of a clock signal finishes, the impulse signal of another clock signal begins.

The sixth clock signal CK2', the seventh clock signal CK4', the fourth clock signal CK3', the eighth clock signal CK1' have the same period and voltage level. The timings of the sixth clock signal CK2', the seventh clock signal CK4', the fourth clock signal CK3', the eighth clock signal CK1' are staggered.

The timings of the first clock signal CK2 and the sixth clock signal CK2' are the same. The timings of the fourth clock signal CK4 and the seventh clock signal CK4' are the same. The timings of the third clock signal CK3 and the fourth clock signal CK3' are the same. The timings of the fifth clock signal CK1 and the eighth clock signal CK1' are the same.

The voltage level of the fourth clock signal CK3' is VGHH. The voltage level of the third clock signal CK3 is VGH. Here, the voltage level VGHH is higher than the voltage level VGH.

When the display panel is in the normal mode to display an image, the first global control signal Gas1 and the second global control signal Gas2 both correspond to a low voltage level such that the seventh TFT T7, the ninth TFT T9 and the tenth TFT T10 are tuned off. The forward scan control signal U2D is a constant high voltage signal. The backward scan control signal D2U is a constant low voltage level signal. Please refer to FIG. 1 and FIG. 2.

In the first phase P1, the stage signal ST(n−2) of a high voltage level is inputted to the gate of the first TFT T1 such that the first TFT T1 is turned on. The second control node Q corresponds to a high voltage level. The sixth TFT T6 is turned on such that the first control node P corresponds to a low voltage level.

In the second phase P2, the first TFT T1, the second TFT T2, the third TFT T3, the fifth TFT T5, the sixth TFT T6, the eighth TFT T8 are all turned off. The second control node Q maintains its high voltage level due to the storage capacitor C1. The first control node P maintains its low voltage level due to the storage capacitor C2.

In the third phase P3, the first TFT T1, the second TFT T2, the third TFT T3, the fifth TFT T5, the sixth TFT T6, the eighth TFT T8 are all turned off. The second control node Q maintains its high voltage level due to the storage capacitor C1. The first control node P maintains its low voltage level due to the storage capacitor C2.

In the fourth phase P4, the first TFT T1 and the second TFT T2 are turned off. The third TFT is tuned on to input a gate voltage of a high voltage level to the fifth TFT T5 such that the fifth TFT T5 is turned on. In this way, the first control node P corresponds to a high voltage level. The eighth TFT T8 is turned on such that the second control node Q corresponds to a low voltage level.

When the first control node P corresponds to a low voltage level and the second control node Q corresponds to a high voltage level, the twelfth TFT T12 and the fourteenth TFT T14 are turned on and the thirteenth TFT T13 and the fifteenth TFT T15 are turned off. The third clock signal of a high voltage level CK3 is inputted to the twelfth TFT T12 such that the twelfth TFT T12 outputs the stage signal St(n). The voltage level of the stage signal St(n) is VGH. The fourth clocks signal CK3' of a higher voltage level is inputted into the fourteenth TFT T14 such that the second electrode of the fourteenth TFT T14 outputs the gate driving signal G(n). The voltage level of the gate driving signal G(n) is VGHH.

The stage signal St(n) of the voltage level VGH is transferred to the LTPS TFTs in the non-display area of a display panel to ensure the stability of the entire driving circuit. The gate driving signal G(n) is transferred to the IGZO TFTs in the display area of the display panel to raise the input current of the IGZO TFTs. This meets the charging demand of the IGZO techniques and solves the issue of insufficient charged voltage level. This technique has two output voltages for driving the display panel, which makes the display panel have a better stability, a lower power consumption, and a better visual effect.

According to an embodiment of the present invention, a display panel is disclosed. The display panel comprises a driving circuit comprising a plurality of cascaded driving units. The driving unit includes a forward/backward scan control module, a first control node controlling module, a second control node controlling module, a global control module, a regulating module, a first output module, and a second output module.

The forward/backward scan control module is configured to control the driving circuit to perform a forward scan according to a forward scan control signal or control the driving circuit to perform a backward scan according to a backward scan control signal.

The first control node controlling module is electrically connected to the forward/backward scan control module. An output end of the first control node controlling module is electrically connected to a first control node to control a voltage level of the first control node.

The second control node controlling module is electrically connected to the forward/backward scan control module and the first control node controlling module. An output end of the second control node controlling module is electrically connected to a second control node to control a voltage level of the second control node.

The global control module is configured to control the driving unit to output a global control signal.

The regulating module is configured to maintain the voltage level of the second control node.

The first output module, electrically connected to the first control node and the second control node, is configured to output a stage signal.

The second output module, electrically connected to the first control node and the second control node, is configured to output a gate driving signal. A voltage level of the gate driving signal is higher than a voltage level of the stage signal.

In some embodiments, the forward/backward scan control module comprises: a first thin film transistor (TFT), having a gate electrically connected to a first stage signal, a first electrode electrically connected to the forward scan control signal, and a second electrode, electrically connected to the second control node; and a second TFT, having a gate receiving a second stage signal, a first electrode electrically connected to the backward scan control signal, and a second electrode electrically connected to the second electrode of the first TFT.

In some embodiments, the first control node controlling module comprises: a third TFT, having a gate electrically connected to the forward scan control signal, a first electrode electrically connected to a first clock signal, and a second electrode; a fourth TFT, having a gate electrically connected to the backward scan control signal, a first electrode electrically connected to a second clock signal, and a second electrode; a fifth TFT, having a gate electrically connected to the second electrode of the third TFT and the second electrode of the fourth TFT, a first electrode electrically connected to a high voltage signal, and a second electrode electrically connected to the first control node; a sixth TFT, having a gate electrically connected to the second electrode of the second TFT, a first electrode electrically connected to a low voltage signal, and a second electrode electrically connected to the first control node; and a seventh TFT, having a gate electrically connected to a first global control signal, a first electrode electrically connected to the low voltage signal, and a second electrode electrically connected to the first control node.

In some embodiments, the second control node controlling module comprises: an eighth TFT, having a gate electrically connected to the first control node, a first electrode electrically connected to the low voltage signal, and a second electrode electrically connected to the second control node.

In some embodiments, the global control module comprises: a ninth TFT, having a gate electrically connected to the first global control signal, a first electrode, electrically connected to the first global control signal, and a second electrode electrically connected to an output end of the second output module; and a tenth TFT, having a gate electrically connected to a second global control signal, a first electrode electrically connected to the low voltage signal, and a second electrode electrically connected to the output end of the second output module.

In some embodiments, the regulating module comprises: an eleventh TFT, having a gate electrically connected to the high voltage signal, a first electrode electrically connected to the second control node, and a second electrode.

In some embodiments, the first output module comprises: a twelfth TFT, having a gate electrically connected to the second electrode of the eleventh TFT, a first electrode electrically connected to a third clock signal, a second electrode electrically connected to an output end of the first output module; and a thirteenth TFT, having a gate electrically connected to the first control node, a first electrode electrically connected to the low voltage signal, and a second electrode electrically connected to the output end of the first output module.

In some embodiments, the second output module comprises: a fourteenth TFT, having a gate electrically connected to the second electrode of the eleventh TFT, a first electrode electrically connected to a fourth clock signal, and a second electrode electrically connected to the output end of the second output module; and a fifteenth TFT, having a gate electrically connected to the first control node, a first electrode electrically connected to the low voltage signal, and a second electrode electrically connected to the output end of the second output module.

In some embodiments, a timing of the fourth clock signal is identical to a timing of the third clock signal, a voltage level of the fourth clock signal is higher than a voltage level of the third clock signal; the timing of the third clock signal and a timing of the second clock signal are staggered; the timing of the second clock signal and a timing of the first clock signal are staggered; the timing of the third clock signal and the timing of the first clock signal are staggered; and the voltage level of the third clock signal is identical to a voltage level of the second clock signal and a voltage level of the first clock signal.

In some embodiments, the stage signal is a driving signal transferred to low temperature poly-silicon (LTPS) TFTs in a non-display area of a display panel, the gate driving signal is a driving signal transferred to oxide TFTs in a display area of the display panel.

According to an embodiment of the present invention, a driving circuit and a display panel are provided. The display panel comprises a driving circuit comprising a plurality of cascaded driving units. The driving unit includes a forward/backward scan control module, a first control node controlling module, a second control node controlling module, a global control module, a regulating module, a first output module, and a second output module. The forward/backward scan control module is configured to control the driving circuit to perform a forward scan according to a forward scan control signal or control the driving circuit to perform a backward scan according to a backward scan control signal. The first control node controlling module is electrically connected to the forward/backward scan control module. An output end of the first control node controlling module is electrically connected to a first control node to control a voltage level of the first control node. The second control node controlling module is electrically connected to the forward/backward scan control module and the first control node controlling module. An output end of the second control node controlling module is electrically connected to a second control node to control a voltage level of the second control node. The global control module is configured to control the driving unit to output a global control signal. The regulating module is configured to maintain the voltage level of the second control node. The first output module, electrically connected to the first control node and the second control node, is configured to output a stage signal. The second output module, electrically connected to the first control node and the second control node, is configured to output a gate driving signal. A voltage level of the gate driving signal is higher than a voltage level of the stage signal. The driving circuit has a first output module for outputting a stage signal having a high voltage level to the LTPS TFTs in the non-display area and has a second output module for outputting a gate driving signal having a voltage level higher than the stage signal, to the IGZO TFTs. This mechanism increases the current to meet the charging demand of the IGZO technique so that the charged voltage level of the IGZO technique is enough. Furthermore, this mechanism also ensures the stability of the entire driving circuit. This technique has two output voltages for driving the display panel, which makes the display panel have a better stability, a lower power consumption, and a better visual effect.

Above are embodiments of the present invention, which does not limit the scope of the present invention. Any modifications, equivalent replacements or improvements within the spirit and principles of the embodiment described above should be covered by the protected scope of the invention.

What is claimed is:

1. A driving circuit, comprising a plurality of cascaded driving units, the driving unit comprising:
a forward/backward scan control module, configured to control the driving circuit to perform a forward scan according to a forward scan control signal or control the driving circuit to perform a backward scan according to a backward scan control signal;
a first control node controlling module, electrically connected to the forward/backward scan control module, wherein an output end of the first control node controlling module is electrically connected to a first control node to control a voltage level of the first control node;
a second control node controlling module, electrically connected to the forward/backward scan control module and the first control node controlling module, wherein an output end of the second control node controlling module is electrically connected to a second control node to control a voltage level of the second control node;
a global control module, configured to control the driving unit to output a global control signal;
a regulating module, configured to maintain the voltage level of the second control node;
a first output module, electrically connected to the first control node and the second control node, configured to output a stage signal; and
a second output module, electrically connected to the first control node and the second control node, configured to output a gate driving signal;
wherein a voltage level of the gate driving signal is higher than a voltage level of the stage signal.

2. The driving circuit of claim 1, wherein the forward/backward scan control module comprises:
a first thin film transistor (TFT), having a gate electrically connected to a first stage signal, a first electrode electrically connected to the forward scan control signal, and a second electrode, electrically connected to the second control node; and
a second TFT, having a gate receiving a second stage signal, a first electrode electrically connected to the backward scan control signal, and a second electrode electrically connected to the second electrode of the first TFT.

3. The driving circuit of claim 2, wherein the first control node controlling module comprises:
a third TFT, having a gate electrically connected to the forward scan control signal, a first electrode electrically connected to a first clock signal, and a second electrode;
a fourth TFT, having a gate electrically connected to the backward scan control signal, a first electrode electrically connected to a second clock signal, and a second electrode;
a fifth TFT, having a gate electrically connected to the second electrode of the third TFT and the second electrode of the fourth TFT, a first electrode electrically connected to a high voltage signal, and a second electrode electrically connected to the first control node;
a sixth TFT, having a gate electrically connected to the second electrode of the second TFT, a first electrode electrically connected to a low voltage signal, and a second electrode electrically connected to the first control node; and
a seventh TFT, having a gate electrically connected to a first global control signal, a first electrode electrically connected to the low voltage signal, and a second electrode electrically connected to the first control node.

4. The driving circuit of claim 3, wherein the second control node controlling module comprises:
an eighth TFT, having a gate electrically connected to the first control node, a first electrode electrically connected to the low voltage signal, and a second electrode electrically connected to the second control node.

5. The driving circuit of claim 4, wherein the global control module comprises:
a ninth TFT, having a gate electrically connected to the first global control signal, a first electrode, electrically connected to the first global control signal, and a second electrode electrically connected to an output end of the second output module; and
a tenth TFT, having a gate electrically connected to a second global control signal, a first electrode electrically connected to the low voltage signal, and a second electrode electrically connected to the output end of the second output module.

6. The driving circuit of claim 5, wherein the regulating module comprises:
an eleventh TFT, having a gate electrically connected to the high voltage signal, a first electrode electrically connected to the second control node, and a second electrode.

7. The driving circuit of claim 6, wherein the first output module comprises:
a twelfth TFT, having a gate electrically connected to the second electrode of the eleventh TFT, a first electrode electrically connected to a third clock signal, a second electrode electrically connected to an output end of the first output module; and
a thirteenth TFT, having a gate electrically connected to the first control node, a first electrode electrically connected to the low voltage signal, and a second electrode electrically connected to the output end of the first output module.

8. The driving circuit of claim 7, wherein the second output module comprises:
a fourteenth TFT, having a gate electrically connected to the second electrode of the eleventh TFT, a first electrode electrically connected to a fourth clock signal, and a second electrode electrically connected to the output end of the second output module; and
a fifteenth TFT, having a gate electrically connected to the first control node, a first electrode electrically connected to the low voltage signal, and a second electrode electrically connected to the output end of the second output module.

9. The driving circuit of claim 8, wherein a timing of the fourth clock signal is identical to a timing of the third clock signal, a voltage level of the fourth clock signal is higher than a voltage level of the third clock signal; the timing of the third clock signal and a timing of the second clock signal are staggered; the timing of the second clock signal and a timing of the first clock signal are staggered; the timing of the third clock signal and the timing of the first clock signal are staggered; and the voltage level of the third clock signal is identical to a voltage level of the second clock signal and a voltage level of the first clock signal.

10. The driving circuit of claim 1, wherein the stage signal is a driving signal transferred to low temperature polysilicon (LTPS) TFTs in a non-display area of a display panel, the gate driving signal is a driving signal transferred to oxide TFTs in a display area of the display panel.

11. A display panel, comprising a driving circuit comprising a plurality of cascaded driving units, the driving unit comprising:
- a forward/backward scan control module, configured to control the driving circuit to perform a forward scan according to a forward scan control signal or control the driving circuit to perform a backward scan according to a backward scan control signal;
- a first control node controlling module, electrically connected to the forward/backward scan control module, wherein an output end of the first control node controlling module is electrically connected to a first control node to control a voltage level of the first control node;
- a second control node controlling module, electrically connected to the forward/backward scan control module and the first control node controlling module, wherein an output end of the second control node controlling module is electrically connected to a second control node to control a voltage level of the second control node;
- a global control module, configured to control the driving unit to output a global control signal;
- a regulating module, configured to maintain the voltage level of the second control node;
- a first output module, electrically connected to the first control node and the second control node, configured to output a stage signal; and
- a second output module, electrically connected to the first control node and the second control node, configured to output a gate driving signal;
- wherein a voltage level of the gate driving signal is higher than a voltage level of the stage signal.

12. The display panel of claim 11, wherein the forward/backward scan control module comprises:
- a first thin film transistor (TFT), having a gate electrically connected to a first stage signal, a first electrode electrically connected to the forward scan control signal, and a second electrode, electrically connected to the second control node; and
- a second TFT, having a gate receiving a second stage signal, a first electrode electrically connected to the backward scan control signal, and a second electrode electrically connected to the second electrode of the first TFT.

13. The display panel of claim 12, wherein the first control node controlling module comprises:
- a third TFT, having a gate electrically connected to the forward scan control signal, a first electrode electrically connected to a first clock signal, and a second electrode;
- a fourth TFT, having a gate electrically connected to the backward scan control signal, a first electrode electrically connected to a second clock signal, and a second electrode;
- a fifth TFT, having a gate electrically connected to the second electrode of the third TFT and the second electrode of the fourth TFT, a first electrode electrically connected to a high voltage signal, and a second electrode electrically connected to the first control node;
- a sixth TFT, having a gate electrically connected to the second electrode of the second TFT, a first electrode electrically connected to a low voltage signal, and a second electrode electrically connected to the first control node; and
- a seventh TFT, having a gate electrically connected to a first global control signal, a first electrode electrically connected to the low voltage signal, and a second electrode electrically connected to the first control node.

14. The display panel of claim 13, wherein the second control node controlling module comprises:
- an eighth TFT, having a gate electrically connected to the first control node, a first electrode electrically connected to the low voltage signal, and a second electrode electrically connected to the second control node.

15. The display panel of claim 14, wherein the global control module comprises:
- a ninth TFT, having a gate electrically connected to the first global control signal, a first electrode, electrically connected to the first global control signal, and a second electrode electrically connected to an output end of the second output module; and
- a tenth TFT, having a gate electrically connected to a second global control signal, a first electrode electrically connected to the low voltage signal, and a second electrode electrically connected to the output end of the second output module.

16. The display panel of claim 15, wherein the regulating module comprises:
- an eleventh TFT, having a gate electrically connected to the high voltage signal, a first electrode electrically connected to the second control node, and a second electrode.

17. The display panel of claim 16, wherein the first output module comprises:
- a twelfth TFT, having a gate electrically connected to the second electrode of the eleventh TFT, a first electrode electrically connected to a third clock signal, a second electrode electrically connected to an output end of the first output module; and
- a thirteenth TFT, having a gate electrically connected to the first control node, a first electrode electrically connected to the low voltage signal, and a second electrode electrically connected to the output end of the first output module.

18. The display panel of claim 17, wherein the second output module comprises:
- a fourteenth TFT, having a gate electrically connected to the second electrode of the eleventh TFT, a first electrode electrically connected to a fourth clock signal, and a second electrode electrically connected to the output end of the second output module; and
- a fifteenth TFT, having a gate electrically connected to the first control node, a first electrode electrically connected to the low voltage signal, and a second electrode electrically connected to the output end of the second output module.

19. The display panel of claim 18, wherein a timing of the fourth clock signal is identical to a timing of the third clock signal, a voltage level of the fourth clock signal is higher than a voltage level of the third clock signal; the timing of the third clock signal and a timing of the second clock signal are staggered; the timing of the second clock signal and a timing of the first clock signal are staggered; the timing of the third clock signal and the timing of the first clock signal are staggered; and the voltage level of the third clock signal is identical to a voltage level of the second clock signal and a voltage level of the first clock signal.

20. The display panel of claim 11, wherein the stage signal is a driving signal transferred to low temperature polysilicon (LTPS) TFTs in a non-display area of a display panel, the gate driving signal is a driving signal transferred to oxide TFTs in a display area of the display panel.

* * * * *